(12) United States Patent
Tsai et al.

(10) Patent No.: US 7,008,554 B2
(45) Date of Patent: Mar. 7, 2006

(54) DUAL REDUCED AGENTS FOR BARRIER REMOVAL IN CHEMICAL MECHANICAL POLISHING

(75) Inventors: Stan D. Tsai, Fremont, CA (US); Shijian Li, San Jose, CA (US); Feng Q. Liu, Cupertino, CA (US); Lizhong Sun, San Jose, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 249 days.

(21) Appl. No.: 10/193,810

(22) Filed: Jul. 11, 2002

(65) Prior Publication Data

US 2003/0013306 A1 Jan. 16, 2003

Related U.S. Application Data

(60) Provisional application No. 60/305,314, filed on Jul. 13, 2001.

(51) Int. Cl.
*C09K 13/00* (2006.01)

(52) U.S. Cl. .................... 252/79.1; 252/79.2; 252/79.4; 438/692

(58) Field of Classification Search ................ 252/79.1, 252/79.2, 79.4; 438/692
See application file for complete search history.

(56) References Cited

U.S. PATENT DOCUMENTS

| 4,920,031 | A | 4/1990 | Ohno et al. | 430/522 |
| 5,340,370 | A | 8/1994 | Cadien et al. | 51/308 |
| 5,676,587 | A | 10/1997 | Landers et al. | 451/57 |

(Continued)

FOREIGN PATENT DOCUMENTS

| EP | 1 006 166 A1 | 6/2000 |
| EP | 1 006 166 | 6/2000 |
| EP | 1 011 131 | 6/2000 |

(Continued)

OTHER PUBLICATIONS

US 5,985,755, 11/1999, Bajaj et al. (withdrawn)
Partial Search Report (Form PCT/ISA/206—Annex) for PCT/US02/22126, dated Dec. 6, 2002.
PCT International Search Report from International Application No. PCT/US01/50150, Dated Sep. 23, 2002.
International Search Report for PCT/US02/00062, dated Jul. 8, 2002.
U.S. Appl. No. 09/569,968, filed May 11, 2000, Sun et al.
U.S. Appl. No. 09/968,863, filed Oct. 27, 2000, Tsai et al.
U.S. Appl. No. 09/968,864, filed Oct. 27, 2000, Sun et al.

(Continued)

*Primary Examiner*—Nadine G. Norton
*Assistant Examiner*—Binh X. Tran
(74) *Attorney, Agent, or Firm*—Moser, Patterson & Sheridan

(57) ABSTRACT

Compositions and methods for removal of barrier layer materials by a chemical mechanical polishing technique are provided. In one aspect, the invention provides a composition adapted for removing a barrier layer material in a chemical mechanical polishing technique including at least one reducing agent selected from the group of bicarboxylic acids, tricarboxylic acids, and combinations thereof, at least one reducing agent selected from the group of glucose, hydroxylamine, and combinations thereof, and deionized water, wherein the composition has a pH of about 7 or less. The composition may be used in a method for removing the barrier layer material including applying the composition to a polishing pad and polishing the substrate in the presence of the composition to remove the barrier layer.

3 Claims, 3 Drawing Sheets

U.S. PATENT DOCUMENTS

| | | | |
|---|---|---|---|
| 5,693,563 A | 12/1997 | Teong | 437/190 |
| 5,735,963 A | 4/1998 | Obeng | 134/3 |
| 5,783,489 A | 7/1998 | Kaufman et al. | 438/692 |
| 5,842,910 A | 12/1998 | Krywanczyk et al. | 451/41 |
| 5,893,796 A | 4/1999 | Birang et al. | 451/526 |
| 5,897,426 A | 4/1999 | Somekh | |
| 5,954,997 A | 9/1999 | Kaufman et al. | 252/79.1 |
| 5,981,454 A | 11/1999 | Small | 510/175 |
| 5,985,748 A | 11/1999 | Watts et al. | 438/622 |
| 6,001,730 A | 12/1999 | Farkas et al. | 438/627 |
| 6,068,879 A | 5/2000 | Pasch | |
| 6,074,949 A | 6/2000 | Schonauer et al. | 438/692 |
| 6,083,840 A | 7/2000 | Mravic et al. | 438/693 |
| 6,113,465 A | 9/2000 | Kim et al. | |
| 6,117,775 A | 9/2000 | Kondo et al. | 438/690 |
| 6,117,783 A | 9/2000 | Small et al. | 438/693 |
| 6,136,714 A | 10/2000 | Schutz | 438/692 |
| 6,143,656 A | 11/2000 | Yang et al. | 438/687 |
| 6,156,661 A | 12/2000 | Small | 438/692 |
| 6,165,052 A | 12/2000 | Yu et al. | |
| 6,183,686 B1 | 2/2001 | Bardus et al. | 419/8 |
| 6,184,141 B1 | 2/2001 | Avanzino et al. | |
| 6,204,169 B1 | 3/2001 | Bajaj et al. | |
| 6,217,416 B1 | 4/2001 | Kaufman et al. | |
| 6,218,290 B1 | 4/2001 | Schonauer et al. | 438/633 |
| 6,235,633 B1 | 5/2001 | Jang | 438/675 |
| 6,238,592 B1 | 5/2001 | Hardy et al. | |
| 6,258,721 B1 | 7/2001 | Li et al. | 438/693 |
| 6,271,416 B1 | 8/2001 | Takagaki et al. | 562/433 |
| 6,313,039 B1 * | 11/2001 | Small et al. | 438/693 |
| 6,355,075 B1 * | 3/2002 | Ina et al. | 51/308 |
| 6,375,559 B1 | 4/2002 | James et al. | 451/527 |
| 6,409,781 B1 | 6/2002 | Wojtczak et al. | |
| 6,432,823 B1 | 8/2002 | Huynh et al. | |
| 6,435,945 B1 | 8/2002 | Somekh | |
| 6,444,569 B1 | 9/2002 | Farkas et al. | |
| 6,709,316 B1 * | 3/2004 | Sun et al. | 451/41 |
| 2001/0013506 A1 | 8/2001 | Chamberlin et al. | 216/88 |
| 2002/0068454 A1 | 6/2002 | Sun et al. | |
| 2002/0090820 A1 | 7/2002 | Sun et al. | 438/690 |
| 2003/0013306 A1 | 1/2003 | Tsai et al. | |
| 2003/0013387 A1 | 1/2003 | Tsai | |
| 2003/0022501 A1 | 1/2003 | Tsai | |
| 2003/0022801 A1 | 1/2003 | Sun et al. | |
| 2003/0029841 A1 | 2/2003 | Moon | |
| 2003/0036339 A1 | 2/2003 | Bonner | |
| 2003/0116445 A1 | 6/2003 | Sun et al. | |
| 2003/0120927 A1 | 6/2003 | Kim | |

FOREIGN PATENT DOCUMENTS

| | | |
|---|---|---|
| EP | 1 085 067 | 3/2001 |
| EP | 1 093 161 A1 | 4/2001 |
| EP | 1 093 161 | 4/2001 |
| EP | 1 104 020 A1 | 5/2001 |
| EP | 1 104 020 | 5/2001 |
| EP | 1 116 762 | 7/2001 |
| EP | 1 116 762 A1 | 7/2001 |
| EP | 1 125 999 A1 | 8/2001 |
| EP | 1 125 999 | 8/2001 |
| FR | 1 603 558 | 6/1971 |
| JP | 2001-127018 | 5/2001 |
| JP | 2001-139937 | 5/2001 |
| KR | 2000011709 | 2/2000 |
| KR | 2000-011709 | 2/2000 |
| WO | WO 98/04646 | 2/1998 |
| WO | WO 98/36045 | 8/1998 |
| WO | WO 98/44061 | 8/1998 |
| WO | WO 98/41671 | 9/1998 |
| WO | WO 98/49723 | 11/1998 |
| WO | WO 99/46081 | 9/1999 |
| WO | WO 00/00561 | 1/2000 |
| WO | WO 00/02235 | 1/2000 |
| WO | WO 00/02238 | 1/2000 |
| WO | WO 00/35627 | 2/2000 |
| WO | WO 00/24842 | 5/2000 |
| WO | WO 00/30159 | 5/2000 |
| WO | 00/35627 | 6/2000 |

OTHER PUBLICATIONS

U.S. Appl. No. 09/755,717, filed Jan. 5, 2001, Sun et al.
U.S. Appl. No. 10/187,857, filed Jun. 27, 2002, Tsai et al.
U.S. Appl. No. 10/215,521, filed Aug. 8, 2002, Sun et al.
PCT International Search Report from International Application No. PCT/US 02/ 22126, dated Mar. 5, 2003.
Written Opinion from PCT International Preliminary Examining Authority for US/02/00062, dated May 12, 2003.
International Search Report for PCT /US02/0062, dated Jul. 8, 2002. (AMAT/5538PCT).
PCT International Search Report from International Application No. PCT/US01/50150, dated Sep. 23, 2002. (AMAT/5084PCT).
Partial Search Report (Form PCT/ISA/206–Annex) for PCT/US02/22126, dated Dec. 6, 2002. (AMAT/5845PCT).
PCT International Search Report from International Application No. PCT/US02/22126, dated Mar. 5, 2003. (AMAT/5845PCT).
Written Opinion from PCT International Preliminary Examining Authority for US/02/00062, dated May 12, 2003. (AMAT/5538PCT).
PCT Written Opinion dated Feb. 28, 2005 for PCT/US01/501150. (AMAT/5084PC).
PCT Written Opinion dated Feb. 24, 2005, for PCT/US02/22126. (AMAT/5845PC).
PCT International Search Report dated Mar. 5, 2003 for PCT/US02/22126. (AMAT/5845PCT).

* cited by examiner

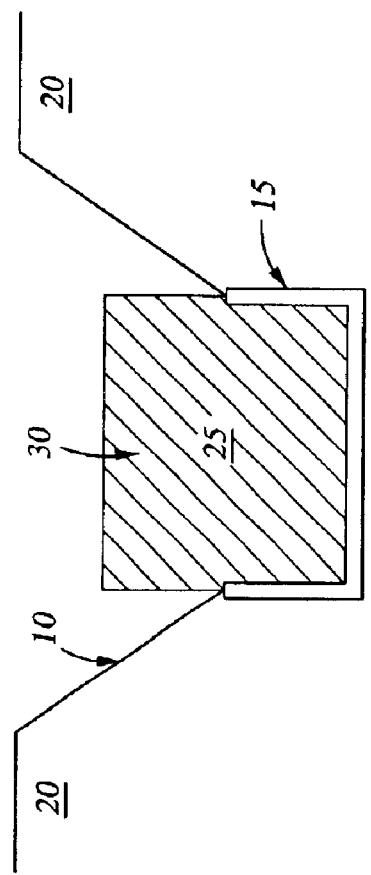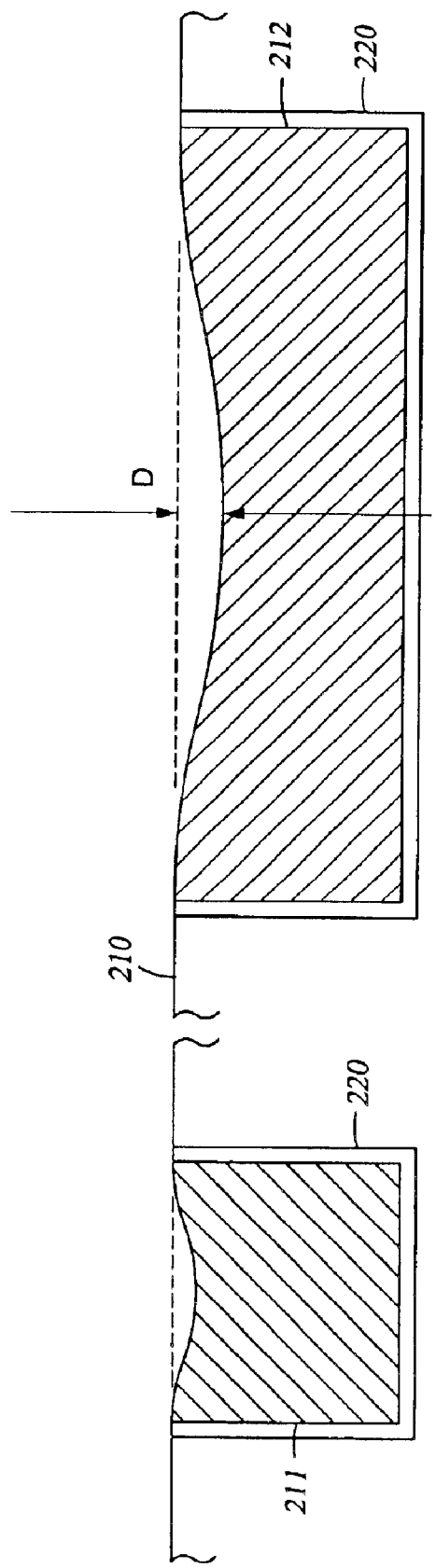
*Fig. 1*
(PRIOR ART)
*Fig. 2*
(PRIOR ART)

DUAL REDUCED AGENTS FOR BARRIER REMOVAL IN CHEMICAL MECHANICAL POLISHING

CROSS-REFERENCE TO RELATED APPLICATIONS

This application claims benefit of U.S. Provisional Patent Application Ser. No. 60/305,314, filed Jul. 13, 2001, which is incorporated herein by reference.

BACKGROUND OF THE INVENTION

1. Field of the Invention

Aspects of the invention relate generally to chemical mechanical polishing and planarization of semiconductor devices and to methods and compositions for removing a barrier layer material by chemical mechanical polishing techniques.

2. Description of the Related Art

Reliably producing sub-half micron and smaller features is one of the key technologies for the next generation of very large-scale integration (VLSI) and ultra large-scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

In order to further improve the current density of semiconductor devices on integrated circuits, it has become necessary to use conductive materials having low resistivity for conductors in feature definitions formed in materials having low dielectric constants (low k, defined herein as having dielectric constants, k, less than about 4.0) as insulating layers to reduce the capacitive coupling between adjacent interconnects. Increased capacitative coupling between layers can detrimentally affect the functioning of semiconductor devices.

One conductive material gaining acceptance is copper and its alloys, which have become the materials of choice for sub-quarter-micron interconnect technology because copper has a lower resistivity than aluminum, (1.7 $\mu\Omega$-cm compared to 3.1 $\mu\Omega$-cm for aluminum), and a higher current carrying capacity. These characteristics are important for supporting the higher current densities experienced at high levels of integration and increased device speed. Further, copper has a good thermal conductivity and is available in a highly pure state.

One difficulty in using copper in semiconductor devices is that copper diffuses into surrounding material, such as the low k dielectric materials. Barrier layers are deposited in feature definitions formed in the low k dielectric materials prior to copper deposition to reduce or minimize copper diffusion into the surrounding material. Barrier layer materials include, for example, tantalum (Ta), tantalum nitride (TaN), titanium (Ti), and titanium nitride (TiN). Following copper deposition, any excess copper material and excess barrier layer material external to the features formed in the low k dielectric materials is then removed.

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in damascene processes to remove excess deposited material and to provide an even surface for subsequent levels of metallization and processing. Planarization may also be used in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. Thus, the CMP apparatus effects polishing or rubbing movement between the surface of the substrate and the polishing pad while dispersing a polishing composition to effect both chemical activity and mechanical activity.

One approach to polishing barrier materials requires the use of reducing agents that chemically react with the deposited barrier materials and remove the barrier materials from the surface. However, it has been observed that the effectiveness of reducing agents is dependent upon the characteristics of feature definitions formed in a substrate surface. For example, some reducing agents remove barrier materials from unetched portions of the substrate surface (known as the field of the substrate) easily, but often leave behind barrier material residue in features formed in the substrate surface. Residues are undesirable since the residues may detrimentally affect subsequent polishing processes.

One solution to removing barrier layer material residues is to increase the polishing pressure and increase the polishing time to ensure barrier layer removal. However, such a processing condition often results in damage or loss of barrier material at the seam 10 between the barrier layer 15 and the surrounding oxide material 20 forming the copper feature 25, as shown in FIG. 1. Damage to the seam 10 can result in exposing the surrounding oxide to the copper material 30 and result in copper diffusion into the oxide material 20. Additionally, increasing the polishing pressure and increasing the polishing time to ensure barrier layer removal may result in overpolishing the barrier layer and form topographical defects, such as concavities or depressions, referred to as dishing.

FIG. 2 is a schematic view of a substrate illustrating the phenomenon of dishing. Conductive lines 211 and 212 are formed by depositing conductive material, such as copper or copper alloy, over a barrier layer 220 in a feature definition formed in the dielectric layer 210, typically comprised of silicon oxides or other dielectric materials. After overpolishing of the barrier layer, for example, a portion of the conductive material may become depressed by an amount D, referred to as the amount of dishing, forming a concave copper surface. Dishing results in a non-planar surface that impairs the ability to print high resolution lines during subsequent photolithographic steps and detrimentally affects subsequent surface topography of the substrate and device formation. Dishing also detrimentally affects the performance of devices by lowering the conductance and increasing the resistance of the devices, contrary to the benefit of using higher conductive materials, such as copper.

Other reducing agents may be used to remove barrier layer materials with reduced residue; however, such compounds remove the barrier layer materials at relatively low removal rates compared to other reducing agents. The low removal rates increase production times, increase production costs, and reduce substrate throughput. One solution to low removal rates is to increase processing parameters, such as polishing pressure. However, such changes in processing parameters have been observed to result in seam damage.

Therefore, there exists a need for a method and related CMP composition that facilitates the removal of barrier layer materials.

SUMMARY OF THE INVENTION

Aspects of the invention provide compositions and methods using a combination of reducing agents for removing barrier layer materials by a chemical mechanical polishing technique with minimal residues and minimal seam damage. In one aspect, the invention provides a composition adapted for removing a barrier layer material in a chemical mechanical polishing technique including at least one reducing agent selected from the group of bicarboxylic acids, tricarboxylic acids, and combinations thereof, at least one reducing agent selected from the group of glucose, hydroxylamine, and combinations thereof, and deionized water, wherein the composition has a pH of about 7 or less. The composition may be used in a method for removing the barrier layer material including applying the composition to a polishing pad and polishing the substrate in the presence of the composition to remove the barrier layer.

In another aspect, a barrier material removal composition is provided that removes tantalum or tantalum nitride from a substrate having an unetched field portion and a dense array of feature definitions portion in a chemical mechanical polishing technique. The composition includes up to about 1 wt. % of at least one reducing agent that selectively removes tantalum or tantalum nitride from the dense array of feature definitions portion, up to about 1 wt. % of at least one reducing agent that selectively removes tantalum or tantalum nitride from the unetched field portion of the substrate, and deionized water, wherein the composition has a pH of about 7 or less.

The barrier material removal composition may be used in a method for polishing a barrier layer on a substrate surface of a substrate having an unetched field portion and a dense array of feature definitions portion. The method includes conformally depositing a barrier layer on the unetched field portion and the dense array of feature definitions portion. A conductive material layer is deposited on the barrier layer and the dense array of feature definitions are filled. The substrate is polished to remove the conductive material layer, and the substrate is then polished with the barrier material removal composition to remove the barrier layer material. The barrier layer includes tantalum, tantalum nitride, and combinations thereof.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 is a schematic view of a substrate illustrating seam damage;

FIG. 2 is a schematic view of a substrate illustrating the phenomenon of dishing;

DETAILED DESCRIPTION OF THE PREFERRED EMBODIMENT

In general, aspects of the invention provide compositions and methods for planarizing a substrate surface with reduced or minimal residue remaining from a polishing process. The invention will be described below in reference to a planarizing process for the removal of residues of excess conductive materials, such as barrier layer materials, from a substrate surface by chemical mechanical planarization, or chemical mechanical polishing (CMP) technique. Chemical mechanical polishing is broadly defined herein as polishing a substrate by chemical activity, mechanical activity, or a combination of both chemical and mechanical activity.

Residual material is broadly defined as any excess conductive material remaining after one or more polishing process steps. Residual materials may include tantalum containing materials, such as tantalum, tantalum nitride or tantalum alloys, such as tantalum silicon nitride, as well as by-products of reacted materials on or from the substrate surface. Residual conductive material may partially or completely cover the surface a substrate. For example, residual material may cover about 25% or less of the surface area of the substrate. Residual material is generally present in an amount covering between about 5% and about 10% of the surface area of a substrate after one or more polishing process steps. Alternatively, residual material does contemplate covering the complete surface area of a substrate up to about 1000 Å thick.

One apparatus for performing the planarizing process and composition described herein is a Mirra® CMP System available from Applied Materials, Inc., as shown and described in U.S. Pat. No. 5,738,574, entitled, "Continuous Processing System for Chemical Mechanical Polishing," the entirety of which is incorporated herein by reference. Although, the CMP process and composition is illustrated utilizing the Mirra® CMP System, any system enabling chemical mechanical polishing using the composition described herein can be used to advantage.

Examples of other suitable polishing apparatuses include the Obsidian 8200C System available from Applied Materials, Inc. and a linear polishing system using a sliding or circulating polishing belt or similar device. An example of a linear polishing system is more fully described in co-pending U.S. patent application Ser. No. 09/244,456, filed on Feb. 4, 1999, and incorporated herein by reference to the extent not inconsistent with the invention. The following apparatus description is illustrative and should not be construed or interpreted as limiting the scope of the invention.

Figure 3:
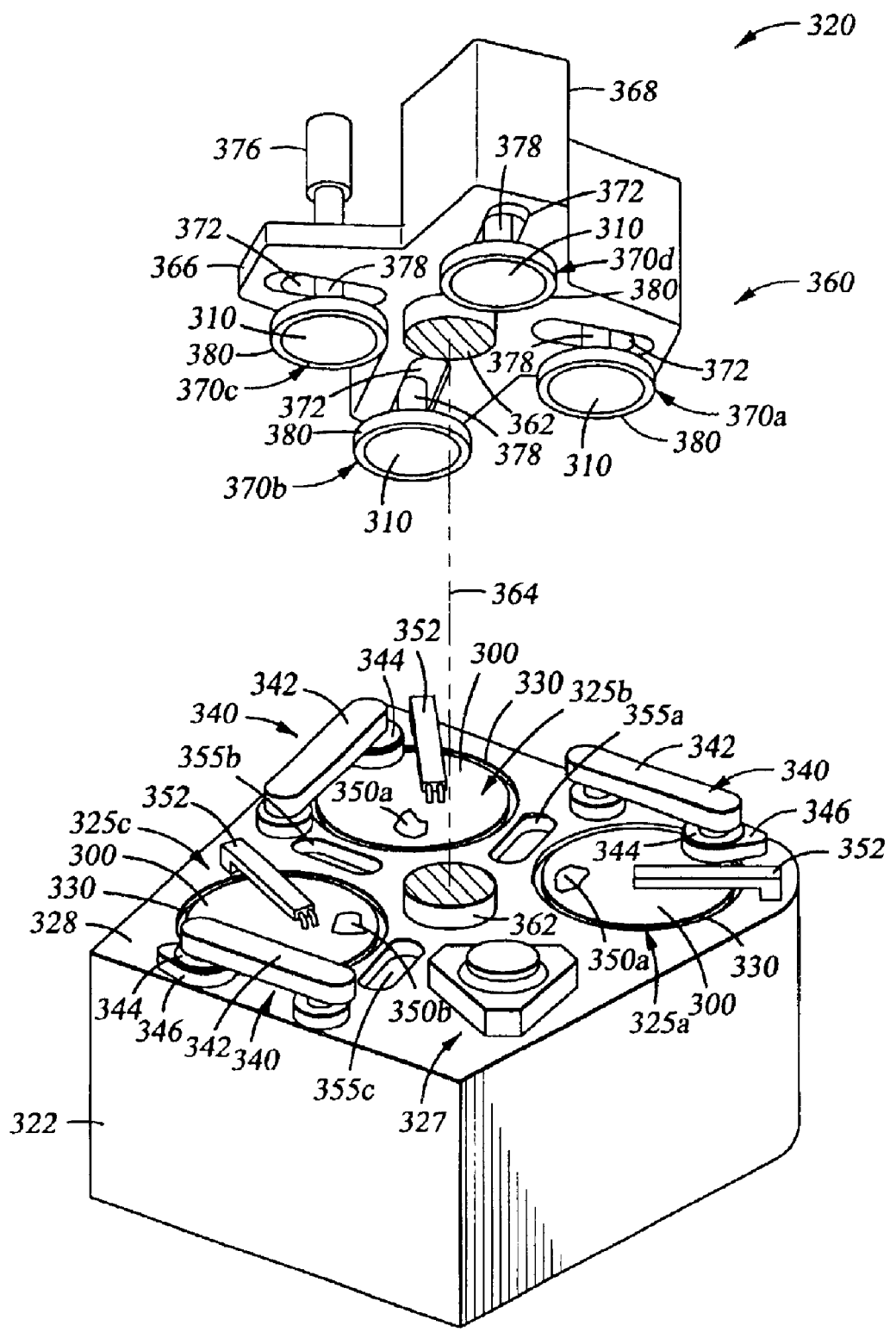
FIG. 3 is a schematic perspective view of a chemical mechanical polishing apparatus.

FIG. 3 is a schematic perspective view of a chemical mechanical polishing apparatus 320. The polishing apparatus 320 includes a lower machine base 322 with a tabletop 328 mounted thereon and a removable outer cover (not shown). The table top 328 supports a series of polishing stations, including a first polishing station 325a, a second polishing station 325b, a final polishing station 325c, and a transfer station 327. The transfer station 327 serves multiple functions, including, for example, receiving individual substrates 310 from a loading apparatus (not shown), loading the substrates into carrier heads 380, receiving the substrates 310 from the carrier heads 380, washing the substrates 310 again, and transferring the substrates 310 back to the loading apparatus.

Each polishing station 325a–325c includes a rotatable platen 330 having a polishing pad 300 disposed thereon. Each platen 330 may be a rotatable aluminum or stainless steel plate connected to a platen drive motor (not shown). The polishing stations 325a–325c may include a pad conditioner apparatus 340. The pad conditioner apparatus 340 has a rotatable arm 342 holding an independently rotating conditioner head 344 and an associated washing basin 346. The pad conditioner apparatus 340 maintains the condition of the polishing pad so that it will effectively polish the substrates. Each polishing station may include a conditioning station if the CMP apparatus is used with other pad configurations.

The polishing stations 325a–325c may each have a slurry/rinse arm 352 that includes two or more supply tubes to provide one or more chemical slurries and/or water to the surface of the polishing pad. The slurry/rinse arm 352 delivers the one or more chemical slurries, i.e., the barrier layer material compositions described herein, in amounts sufficient to cover and wet the entire polishing pad. Each slurry/rinse arm 352 also includes several spray nozzles (not shown) that may provide a high-pressure fluid rinse on to the polishing pad at the end of each polishing and conditioning cycle. Furthermore, two or more intermediate washing stations 355a, 355b, and 355c may be positioned between adjacent polishing stations 325a, 325b, and 325c to clean the substrate as it passes from one station to the next. Applying a composition to a polishing pad as used herein is understood to mean applying the composition to the polishing pad, the substrate, and/or to any other working piece in the CMP apparatus.

A rotatable multi-head carousel 360 is positioned above the lower machine base 322. The carousel 360 includes four carrier head systems 370a, 370b, 370c, and 370d. Three of the carrier head systems receive or hold the substrates 310 by pressing them against the polishing pads 300 disposed on the polishing stations 325a–325c. One of the carrier head systems 370a–370d receives a substrate from and delivers a substrate 310 to the transfer station 327. The carousel 360 is supported by a center post 362 and is rotated about a carousel axis 364 by a motor assembly (not shown) located within the machine base 322. The center post 362 also supports a carousel support plate 366 and a cover 368.

The four carrier head systems 370a–370d are mounted on the carousel support plate 366 at equal angular intervals about the carousel axis 364. The center post 362 allows the carousel motor to rotate the carousel support plate 366 and orbit the carrier head systems 370a–370d about the carousel axis 364. Each carrier head system 370a–370d includes one carrier head 380. A carrier drive shaft 378 connects a carrier head rotation motor 376 (shown by the removal of one quarter of the cover 368) to the carrier head 380 so that the carrier head 380 may independently rotate about its own axis. There is one carrier drive shaft 374 and motor 376 for each head 380. In addition, each carrier head 380 independently oscillates laterally in a radial slot 372 formed in the carousel support plate 366.

The carrier head 380 performs several mechanical functions. Generally, the carrier head 380 holds the substrate 310 against the polishing pad 300, evenly distributes a downward pressure across the back surface of the substrate 310, transfers torque from the drive shaft 378 to rotate the substrate 310, and ensures that the substrate 310 does not slip out from beneath the carrier head 380 during polishing operations. In one embodiment, the carried head 380 exerts a pressure between about 1 psi and about 8 psi against the substrate on the polishing pad 300 during CMP, and the substrate 310 is then polished for a requisite amount of time sufficient for removal of the desired layer or depth.

Barrier Material Removal Compositions

One embodiment of the barrier material removal composition includes at least one reducing agent selected from the group of bicarboxylic acids, tricarboxylic acids, and combinations thereof, at least one reducing agent selected from the group of glucose, hydroxylamine, and combinations thereof, and deionized water, wherein the composition has a pH of about 7 or less. The composition may further include a surfactant or abrasive particles. The CMP composition may also include polishing composition additives, for example, a buffer for pH stability, a pH adjusting agent, a corrosion inhibitor, a metal chelating agent, or combinations thereof.

Generally, for reducing agents, there is no upper limit to the concentration of the reducing agent because excess reducing agent does not impair the effective removal rate of the composition. However, because reducing agents add expense to the processing of substrates, ideally as little as possible of the reducing agents is used in the composition while still providing commercially practicable removal rates. For example, both the acid and base reducing agents may be present in the composition at a concentration of about 10 wt. % or less.

The bicarboxylic acids or tricarboxylic acids may be present in the composition at a concentration of about 1 wt. % or less. A concentration between about 0.01 wt. % and about 0.5 wt. % of the bicarboxylic acids or tricarboxylic acids may be used in the composition. A concentration of about 0.2 wt. % of bicarboxylic acids or tricarboxylic acids has been observed to be sufficient for polishing barrier layer materials. Examples of bicarboxylic acids include, but are not limited, to ascorbic acid, gluconic acid, malic acid, malonic acid, oxalic acid, succinic acid, tartaric acid, and combinations thereof. Examples of tricarboxylic acids include, but are not limited to citric acid, gallic acid, and combinations thereof. The above described bicarboxylic acids or tricarboxylic acids are illustrative and should not be construed or interpreted as limiting the scope of the invention.

The reducing agent including hydroxylamine, glucose, or combinations thereof, may be present in the composition at a concentration of about 1 wt. % or less. A concentration between about 0.01 wt. % and about 0.5 wt. % of the base reducing agent may be used in the composition. A concentration of about 0.2 wt. % of the reducing agent including hydroxylamine, glucose, or combinations thereof, has been observed to be sufficient for polishing barrier layer material. Other examples of suitable reducing agents include sulfothionate, potassium iodide, and combinations thereof. The above described reducing agents are illustrative and should not be construed or interpreted as limiting the scope of the invention.

The reducing agents are disposed in a solvent, such as water. Deionized water is used to prevent or minimize any chemical reactions between the reducing agents and other additives with any contaminants in the solvent.

The pH of the composition is derived so that both the acid reducing agent and the base reducing agent are chemically active during the polishing process. Generally, both the acid and base reducing agents are chemically active in an acidic medium or a neutral medium. For example, hydroxylamine is active as a reducing agent at a pH of between about 3 to about 11 and oxalic acid is active as a reducing agent at a pH of between about 3 to about 7. In one embodiment, a pH of about 7 or less, such as between about 3 and 7, may be used in the polishing composition. A pH of about 6 has been used with the reducing agents described herein to satisfactorily polish barrier layer materials.

The composition may further include at least one pH adjusting agent to provide the pH in which the reducing agents are chemically active. The pH adjusting agent may be any organic or inorganic bases and acids, for example, potassium hydroxide (KOH), acetic acid, phosphoric acid, or nitric acid, at a concentration sufficient to provide the composition with a selected pH.

The composition may further include a buffer agent to provide for a relatively stable pH environment in the range in which the reducing agent is active. The buffer agent includes, but is not limited to, an alkali metal bicarbonate or tetraborate-tetrahydrate salt, for example, potassium bicarbonate or potassium tetraborate-tetrahydrate. The buffer agent may be present at a concentration between about 0.1 wt. % and about 8 wt. %. The amount of buffering agent used may vary on the pH of the solution as well as the variable ability of the buffering agent to buffer the polishing composition.

Optionally, surfactants may be used in the CMP composition to increase the dissolution or solubility of materials, such as metals and metal ions or by-products produced during the CMP process, increase the stability of the slurry, or reduce re-deposition of materials on the substrate being processed. Anionic surfactants selected from the group of potassium oleate, sulfosuccinates, sulfosuccinate derivatives, sulfates of alcohols, alkylanyl sulfonates, carboxylated alcohols, and combinations thereof, may be used in the composition, additionally, commercially available surfactants, such as ALCO SPERSE 124 from ALCO Chemical of Chattanooga, Tenn., may be used as the surfactant in the polishing composition. The above described surfactants are illustrative and should not be construed or interpreted as limiting the scope of the invention.

Surfactants may comprise a concentration between about 0.001 wt. % and about 10 wt. % of the CMP composition. A concentration between about 0.01 wt. % and about 2.0 wt. % of the surfactants is used in one embodiment of the CMP composition. A composition having between about 0.1 wt. % and about 1 wt. %, such as about 0.2 wt. % may also be used.

In addition, the composition may further include a corrosion inhibitor to prevent corrosion of the conductive material in the features or inhibit the polishuing rate of the polishing composition. In one embodiment, the corrosion inhibitors may be various organic compounds containing an azole group, such as mercaptobenzotriazole, 5-methyl-1-benzotriazole, benzotriazole (BTA), and combinations thereof. The corrosion inhibitor may be present at a concentration of about 2 wt. % or less. A concentration of corrosion inhibitor between about 0.02 wt. % and about 0.4 wt. % may be used in the composition.

In one embodiment, the composition may further include abrasive particles, such as silica ($SiO_2$), alumina ($Al_2O_3$), titania ($TiO_2$), ceria ($CiO_2$) particles or combinations thereof, present in a concentration of about 10 wt. % or less. The abrasive particles are generally present in the composition at a concentration of about 5 wt. % or less. Abrasive concentrations between about 0.01 and about 2 wt. % may also be used. A polishing composition having an abrasive concentration between about 0.1 wt. % and about 1 wt. %, such as between about 0.1 wt. % and about 0.5 wt. %, have been found sufficient for polishing barrier layer materials.

An example of a composition described herein includes about 0.5 wt. % oxalic acid, about 0.4 wt. % of hydroxylamine, about 0.2 wt. % of a surfactant, about 1 wt. % of silica abrasive particles, deionized water, and a pH of about 6.

Another example of a composition described herein includes about 0.2 wt. % oxalic acid, about 0.25 wt. % of hydroxylamine, about 0.2 wt. % of BTA, about 1 wt. % of silica abrasive particles, deionized water, and a pH of about 5.8.

The operative mechanism by which the CMP composition facilitates rapid and selective planarization of tantalum containing barrier layer materials is not known with certainty. Not limiting to any one theory, it is believed that the acid-based reducing agents remove barrier layer materials from a dense array of feature definitions at a higher rate than material disposed on an unetched field of the substrate, for example, at 300 Å/min at 5 psi in the array compared to 150 Å/min the via; and the reducing agent including hydroxylamine, glucose, or combinations thereof, removes barrier layer material from the unetched field of the substrate surface at a higher rate than from the portion of the substrate including the dense array of feature definitions, for example, at 500 Å/min at less than 1 psi from the unetched filed while leaving residue in the dense array of feature definitions. Moreover, the use of both types of reducing agents has been observed to minimize dishing and to produce good uniformity of planarization on the substrate in comparison to conventional barrier material removal compositions.

Additionally, the compositions herein have been observed to be selective in removing barrier layer material over other materials, such as dielectric materials or copper containing materials. Selective to a "material" is broadly defined herein as a selected removal of one material at a higher rate than other materials or adjacent materials in a CMP process. For example, selective to a barrier layer material is removing barrier layer material at a higher rate than adjacently disposed dielectric materials. For example, selectively removing a material can also include selectively removing a material from a dense array of feature definition includes removing materials from the dense array of feature definitions at a higher rate than from a featureless field which includes a low feature definition density portion of a substrate.

The composition described herein may remove barrier layer materials at a removal rate ratio, i.e., removal rate of barrier layer material versus removal rate of dielectric material or copper-containing material, of about 5:1 or greater, such as up to about 50:1 or greater. For example, one embodiment of the composition described herein removes barrier layer material at a removal rate of between about 300 Å/min and about 500 Å/min with a dielectric removal rate of about 50 Å/min, or a selectivity of between about 6:1 and about 10:1 of barrier layer material to dielectric material.

Polishing substrate with the polishing compositions described herein may include positioning the substrate on a platen containing a polishing pad 300 disposed on platen 330 in polishing station 325*a*.

The polishing pad 300 is rotated at a platen rotational speed of about 15 cps (greater than about 10 rpms for a 20 inch rotating platen). For example in a convention polishing process, the platen may have a platen rotational speed between about 26 cps and 130 cps (e.g., between about 20 rpms and about 100 rpms for a 20 inch rotating platen). Alternatively, in a high rotational speed polishing process, the platen may be rotated at about 200 cps or greater (150 rpm or greater), such as between about 200 cps and about 1000 cps (about 150 rpm to about 750 rpms). The substrate disposed in a carrier head system 370 is rotated at a rotational speed between about 150 rpm and about 500 rpm.

The substrate and polishing pad are contacted at a polishing pressure of about 6 or less psi. For example, the polishing pad may be contacted in a conventional polishing process at a polishing pressure between about 2 psi and about 6 psi. In a low down-force/high rotational rate polishing process, a pressure of less than about 2 psi, such as between about 0.1 psi and about 1.0 psi, is generally applied between the substrate and the polishing media during the polishing process. A polishing pressure between about 0.5 psi and about 0.8 psi may be used. For polishing substrates having low k material disposed thereon, a pressure of about 1.5 psi or less, such as between about 0.1 psi and about 1.0 psi, is generally applied during the polishing process The polishing composition is supplied to the polishing pad 100a at a flow rate of about 100 ml/min or greater from a storage medium disposed near the CMP apparatus. Typically, a flow rate of between about 100 ml/min and about 300 ml/min may be supplied to the polishing pad for polishing the substrate. The substrate and the polishing pad are typically exposed to the polishing composition and contacted for a period of time sufficient to remove at least a portion or all of the bulk copper-containing material disposed thereon. For example, the polishing pad may be exposed to the first polishing composition between about 30 seconds and about 180 seconds, but may vary. The barrier material may be removed at a rate of about 150 Å/min or greater, for example between about 150 Å/min and about 1000 Å/min.

Figure 4:
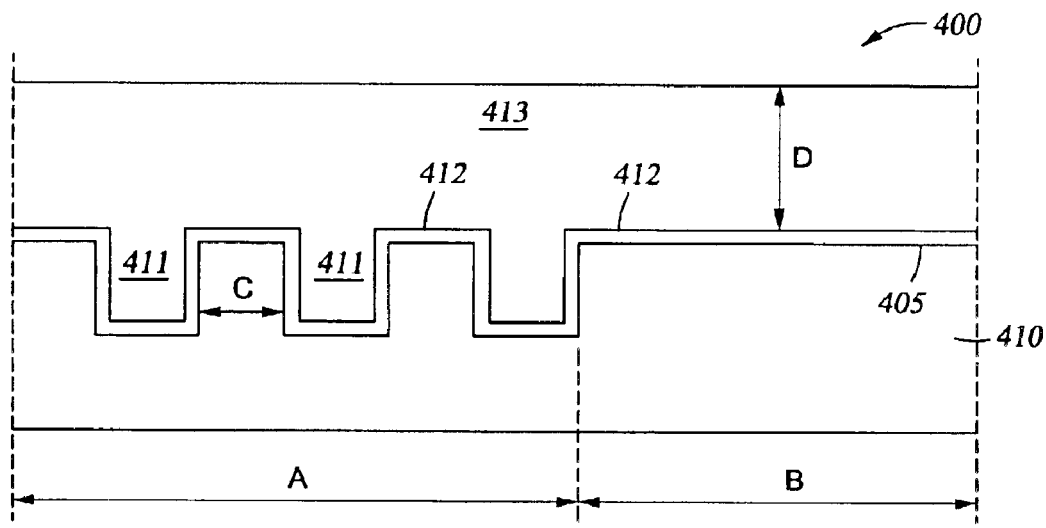
FIGS. 4–6 are schematic diagrams of a substrate illustrating one embodiment of a process for planarizing a substrate surface described herein.
Figure 5:
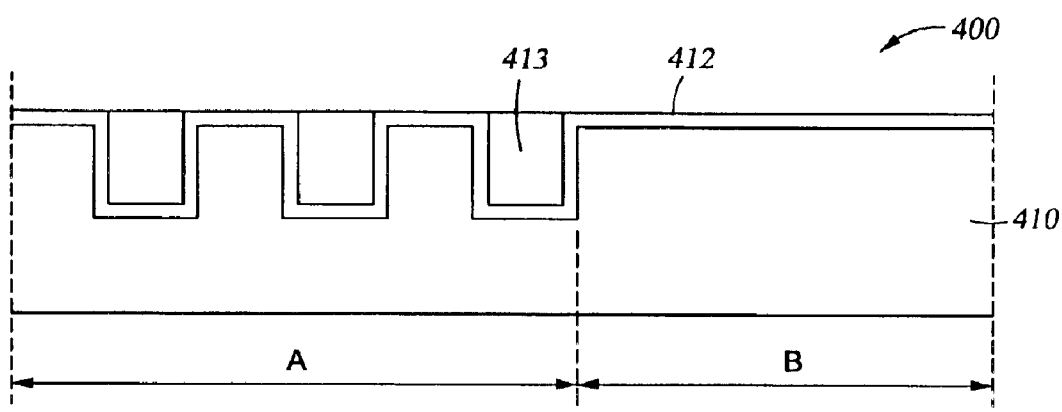
Figure 6:
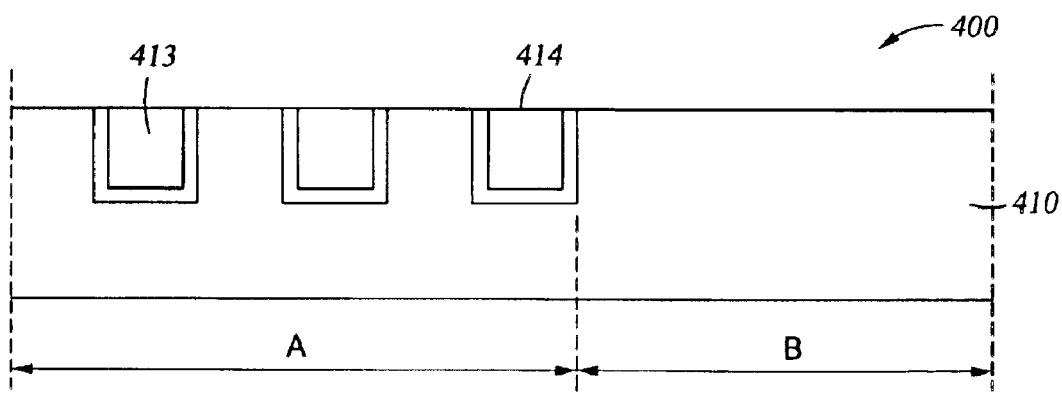

FIGS. 4–6 are a series of schematic cross-sectional views of a substrate illustrating sequential phases of a process for forming an in-laid metallization pattern utilizing the planarization process described herein. The substrate includes a low k dielectric layer with a dense array of feature definitions formed therein, a tantalum containing barrier layer conformally deposited on the low k dielectric layer and in the feature definitions formed therein, and a copper layer deposited on the barrier layer and filling the feature definitions formed therein.

FIG. 4 is a schematic cross-sectional view of an example of one type of feature formed on a substrate that requires planarization. The substrate includes a dielectric layer 410 formed on a substrate 400. A plurality of apertures 411, such as vias, trenches, or holes, are patterned and etched into the dielectric layer 410 in area A forming feature definitions for a dense array of conductive lines with area B being unetched or having a low density of feature definitions. The openings 411 are spaced apart by a distance C that may be any distance. The openings 411 may be formed in the dielectric layer 410 by conventional photolithographic and etching techniques. A barrier layer 412 is disposed conformally in the openings 411 and on the field 405 of the substrate 400. A conductive material layer 413 is disposed on the barrier layer at a thickness (D). The term "conductive material layer" as used herein is defined as any conductive material, such as copper or aluminum, used to fill a feature to form lines, contacts, or vias.

One type of conductive material layer 413 comprises copper containing materials. Copper containing materials include copper, copper alloys (e.g., copper-based alloys containing at least about 80 weight percent copper), or doped copper. As used throughout this disclosure, the phrase "copper containing material," the word "copper," and the symbol "Cu" are intended to encompass copper, copper alloys, doped copper, and combinations thereof.

The barrier layer 412 comprises tantalum, tantalum nitride, or combinations thereof. As used throughout this disclosure, the word "tantalum" and the symbol "Ta" are intended to encompass tantalum, tantalum nitride, and alloys, such as tantalum silicon nitride, or combinations thereof. Other types of barrier layers 412 comprise titanium, titanium nitride, refractory metals, refractory metal nitrides, and combinations thereof.

The dielectric layer 410 may comprise any of various dielectric materials conventionally employed in the manufacture of semiconductor devices. For example, dielectric materials may include materials such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD). The dielectric layer may also comprise low dielectric constant materials, including fluoro-silicon glass (FSG), polymers, such as polyamides, and carbon-containing silicon oxides, such as Black Diamond™, available from Applied Materials, Inc. of Santa Clara, Calif.

In one embodiment, the method of planarizing the substrate 400 includes a CMP process for removing the conductive material layer 413 above the barrier layer 412. Generally, the CMP process uses a slurry composition to selectively remove the bulk conductive material layer 413 to the barrier layer 412 as shown in FIG. 5. If necessary, some overpolishing may be performed during bulk removal to ensure complete removal of the conductive material layer 413 whereby a portion of the underlying barrier layer 412 material may be removed, depending on the selectivity of the composition.

However, the copper removal process provided above is illustrative and should not be construed or interpreted as limiting the scope of the invention. For example, the copper may be removed in a two step process having the bulk of the copper 413 removed by a non-selective copper polishing composition and the finishing removal of the copper 413 by a selective copper polishing composition to minimize or reduce dishing.

Referring to FIG. 6, the barrier layer material (412 of FIG. 5), such as a tantalum barrier layer, is removed above the underlying dielectric layer 410, thereby planarizing the surface of the substrate. A barrier removal polishing composition described herein is applied to remove the barrier material at a rate of at least about 250 Å/min, and generally at a rate of at least about 750 Å/min, from the dense array of features A and the field of the substrate B.

An example of the barrier removal process includes positioning a substrate on an appropriated polishing pad, such as an IC pad available from Rodel, Inc. of Newark, Del., disposed on a platen in a Mirra® CMP System available from Applied Materials, Inc. A composition including about 0.2 wt. % oxalic acid, between about 0.15 wt. % and about 2 wt. % of hydroxylamine, such as about 0.25 wt. % hydroxylamine, about 0.2 wt. % of BTA, about 1 wt. % of silica abrasive particles, deionized water, and a pH between about 5.8 and about 6, such as about 5.8, is delivered to the substrate surface for polishing. The pressure between the substrate and the polishing pad was about 0.5 psi and the polishing pad and the substrate were rotated relative to one another at a rate of about 700 rpms. The substrate is then polished for a requisite amount of time sufficient to remove all or substantially all of the barrier layer to the dielectric layer.

While the foregoing is directed to embodiments of the present invention, other and further embodiments of the invention may be devised without departing from the basic scope thereof, and the scope thereof is determined by the claims that follow.

What is claimed is:

1. A composition adapted for removing barrier layer materials in a chemical mechanical polishing technique, comprising:
   about 0.2 wt. % oxalic acid;
   about 0.25 wt. % hydroxylamine;
   about 0.2 wt. % benzotriazole;
   about 1 wt. % abrasive particles;
   deionized water; and
   a pH of about 5.8.

2. The composition of claim 1, wherein the barrier layer material comprises a material selected from the group consisting of tantalum, tantalum nitride, and combinations thereof.

3. A composition adapted for removing tantalum or tantalum nitride from a substrate having an unetched field portion and a dense array of feature definitions portion in a chemical mechanical polishing technique, comprising:
   about 0.2 wt. % oxalic acid that selectively removes tantalum or tantalum nitride from the dense array of feature definitions portion;
   about 0.25 wt. % hydroxylamine that selectively removes tantalum or tantalum nitride from the unetched portion field of the substrate;
   about 0.2 wt. % 0/o benzotriazole;
   about 1 wt. % abrasive particles;
   deionized water; and
   a pH of about 5.8.

* * * * *

UNITED STATES PATENT AND TRADEMARK OFFICE
CERTIFICATE OF CORRECTION

PATENT NO. : 7,008,554 B2  Page 1 of 1
APPLICATION NO. : 10/193810
DATED : March 7, 2006
INVENTOR(S) : Stan D. Tsai et al.

It is certified that error appears in the above-identified patent and that said Letters Patent is hereby corrected as shown below:

In the Claims

Column 12, Claim 3, Line 12: Delete "0/o"

Signed and Sealed this

Sixth Day of March, 2007

JON W. DUDAS
*Director of the United States Patent and Trademark Office*